United States Patent
Hirafuji et al.

(10) Patent No.: US 7,130,193 B2
(45) Date of Patent: Oct. 31, 2006

(54) CABINET HAVING HEAT RADIATION FUNCTION AND HEAT RADIATION MEMBER

(75) Inventors: Kazuo Hirafuji, Kawasaki (JP); Hideki Sonobe, Kawasaki (JP); Yoshihisa Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 162 days.

(21) Appl. No.: 10/855,056

(22) Filed: May 27, 2004

(65) Prior Publication Data
US 2005/0168951 A1 Aug. 4, 2005

(30) Foreign Application Priority Data
Jan. 29, 2004 (JP) .............................. 2004-021522

(51) Int. Cl.
*H05K 7/20* (2006.01)
(52) U.S. Cl. .................. 361/700; 361/701; 361/714; 165/104.33; 165/104.34
(58) Field of Classification Search ............ 165/104.33; 361/687–690, 700
See application file for complete search history.

(56) References Cited

U.S. PATENT DOCUMENTS

| | | | |
|---|---|---|---|
| 4,306,613 A | * | 12/1981 | Christopher ................ 165/276 |
| 4,600,050 A | * | 7/1986 | Noren .................... 165/104.14 |
| 5,842,514 A | * | 12/1998 | Zapach et al. ......... 165/104.33 |
| 6,104,611 A | | 8/2000 | Glover et al. |
| 6,778,394 B1 | * | 8/2004 | Oikawa et al. ............. 361/700 |

FOREIGN PATENT DOCUMENTS

| | | |
|---|---|---|
| EP | 0 946 085 | 9/1999 |
| JP | 59-169159 | 9/1984 |
| JP | 6-235591 | 8/1994 |
| JP | 7-083582 | 3/1995 |
| JP | 7-113588 | 5/1995 |
| WO | WO 02/17698 | 2/2002 |

* cited by examiner

*Primary Examiner*—Michael Datskovskiy
(74) *Attorney, Agent, or Firm*—Katten Muchin Rosenman LLP

(57) ABSTRACT

The invention relates to a heat radiation member and a cabinet to be installed outdoors in a hermetic state, having a heat radiation function for heat radiation of devices contained therein. The object of the invention is to facilitate maintenance, downsize the cabinet, and prevent occurrence of noise. It includes: a cabinet body containing a heat source; a cover member attached to an aperture of the cabinet and having a guide portion guiding, to an exterior of the cabinet, a heat transfer member for transferring therethrough heat from the heat source by use of a hydraulic fluid; and a heat radiation part being a thermal conductor and in contact with the heat transfer member on a face and covering the heat transfer member from the exterior of the cabinet and having a heat radiation member on a face opposite to the face in contact with the heat transfer member.

8 Claims, 5 Drawing Sheets

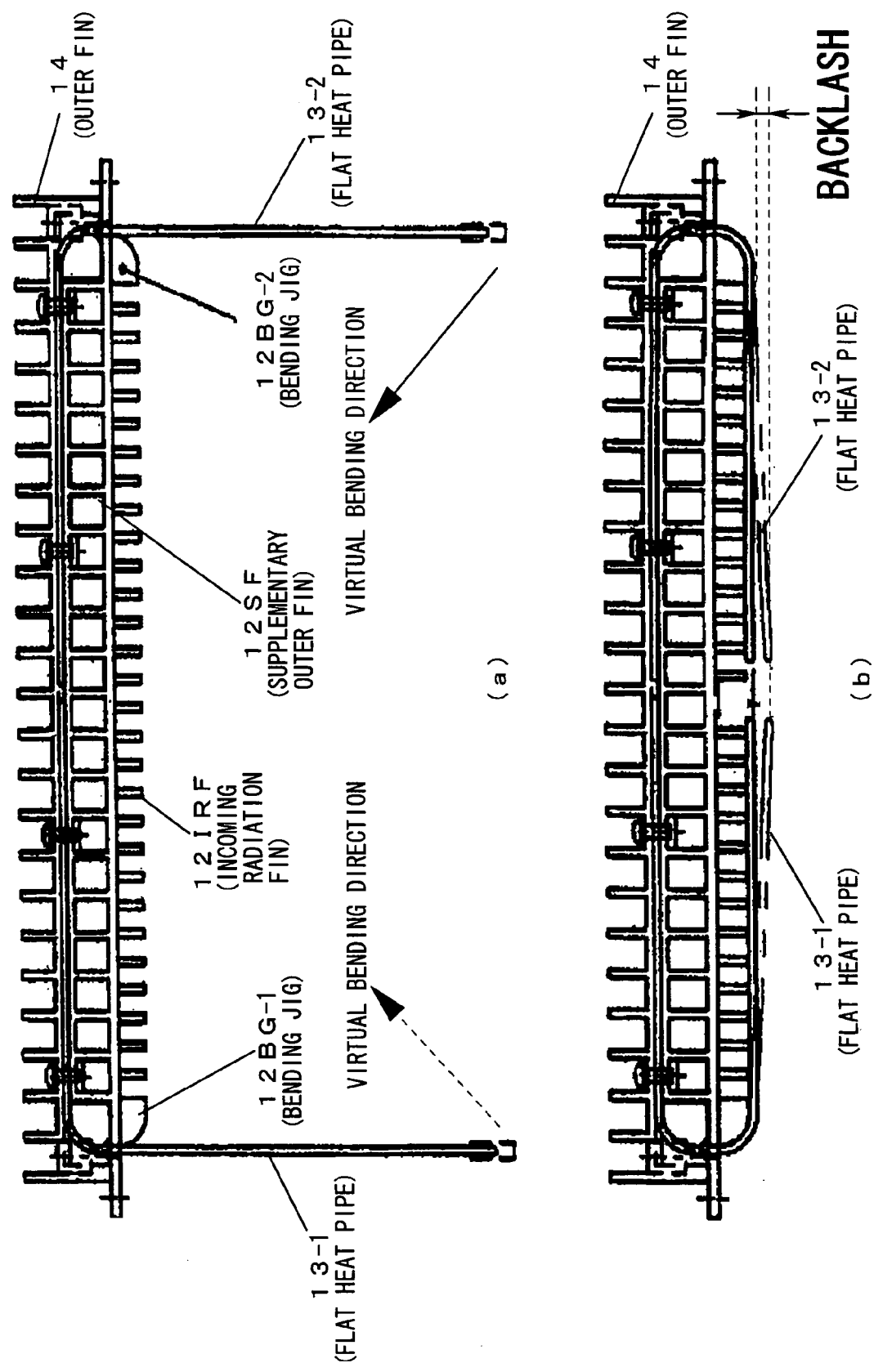

CABINET HAVING HEAT RADIATION FUNCTION AND HEAT RADIATION MEMBER

CROSS REFERENCE TO RELATED APPLICATION

This application is based upon and claims the benefit of priority from Japanese Patent Application No. 2004-021522, filed on Jan. 29, 2004, the entire contents of which are incorporated herein by reference.

BACKGROUND OF THE INVENTION

1. Field of the Invention

The present invention relates to a cabinet installed outdoors in a hermetic state and realizing heat radiation of devices contained therein, and to a heat radiation member.

2. Description of the Related Art

Recent years have seen a rapid increase in the number of portable type terminals accessing a mobile communication system, so that a radio base station apparatus forming a wireless zone in such a mobile communication system has been demanded for downsizing as well as increasing transmission power.

The downsizing and the increasing of the transmission power are technically contradictory demands, however, in case of installing the radio base station apparatus in a residential area, severe demands for reduction of noises imposes great restrictions on thermal design and mounting of the radio base station apparatus.

For a prior art technique for heat radiation realizing both of the downsizing of and increasing of the transmission power of the radio base station apparatus, for example, promotion of heat radiation according to a forced air cooling using a heat pipe is disclosed in the following References 1 to 3.

[Reference 1] Japanese Unexamined Patent Application Publication No. Hei 6-235591 (Abstract)

[Reference 2] Japanese Unexamined Patent Application Publication No. Hei 7-83582 (Abstract)

[Reference 3] Japanese Unexamined Patent Application Publication No. Hei 7-113588 (Abstract)

All of the abovementioned prior arts, however, entail high costs and do not always achieve sufficiently high total reliability because fans used for forced air cooling generate a lot of noise and need to be exchanged for maintenance. Here, it is not necessary to exchange the fans if the heat radiation is sufficient by a natural air cooling.

However, the natural air cooling is good for radiation of heat of small quantity, and it works only when a radiator has a sufficiently large heat radiation area. Besides, the increase in the heat radiation area leads to prevention of the downsizing of the radio base station apparatus, so that in reality, it is difficult to apply the natural air cooling to the radio base station apparatus whose essential portions are contained inside a hermetic cabinet so as not to be weather-beaten outdoors.

SUMMARY OF THE INVENTION

It is an object of the present invention to provide a cabinet having a heat radiation function and a heat radiation member that are downsized and can improve serviceability and prevent occurrence of noise without imposing great restrictions on their shapes and structures.

It is another object of the present invention to maintain, at low cost, without noises, prescribed operation temperature of an apparatus or a system to which the present invention is applied in diversified environments, and to expand the system or apparatus with increases in the power consumption without impairing the downsizing thereof.

It is still another object of the present invention to stably and efficiently radiate heat generated inside a cabinet by a natural air cooling and by a heat transfer member with no coating thereon which prevents the heat radiation.

It is yet another object of the present invention to freely dispose a heat source inside a cabinet and freely decide with low cost the shape, size, and arrangement of a mechanism provided in a cover member and guiding a heat transfer member.

It is yet another object of the present invention to efficiently radiate, by the natural air cooling, heat other than the heat transmitted to a heat transfer member from a heat source inside a cabinet.

It is yet another object of the present invention to efficiently radiate heat by the aforesaid natural air cooling even with a component thermally coupled to a heat transfer member disposed near the tip of an incoming radiation fin.

It is yet another object of the present invention to stably radiate heat generated inside the cabinet by the natural air cooling even when the cabinet includes a cover member for insulating a transfer member from both or one of the interior and exterior of the cabinet and for securing a heat radiation route from the heat transfer member to the exterior but this cover member does not directly function as a radiation fin.

The present invention is summarized as follows.

A cabinet of a first invention includes a cabinet body containing a heat source. A cover member is attached to an aperture of the cabinet and includes a guide portion that guides, to an exterior of the cabinet, a heat transfer member transferring therethrough heat from the heat source by use of a hydraulic fluid. A heat radiation part is a thermal conductor and in contact with the heat transfer member on a face, and covers the heat transfer member from the exterior of the cabinet and has a heat radiation member on a face opposite to the face in contact with the heat transfer member.

In such a cabinet having a heat radiation function according to the invention, the heat is transmitted to the heat transfer member from the heat source inside the cabinet and radiated to the exterior of the cabinet via the heat transfer member. Further, the heat not transmitted to the heat transfer member and remaining inside the cabinet is radiated to the exterior from the aforesaid heat radiation member as a thermal conductor. In addition, the heat radiation member insulates the heat transfer member from the exterior of the cabinet. Consequently, it is possible to stably and efficiently radiate the heat generated inside the cabinet by the natural air cooling since the heat transfer member has no coating thereon which prevents the heat radiation.

A cabinet of a second invention includes a cabinet body containing a heat source. A cover member is attached to an aperture of the cabinet and includes a guide portion that guides, to an exterior of the cabinet, a heat transfer member transferring therethrough heat from the heat source by use of a hydraulic fluid. A first heat radiation member has heat conductivity and has ventilation holes between a portion of the heat transfer member protruding to the exterior of the cabinet and the cover member. A heat radiation part is a thermal conductor and in contact with the heat transfer member, and it covers a portion of the heat transfer member protruding from the cover member to the exterior of the cabinet so as not to cover more than ventilation hole of the heat radiation member, and has a heat radiation member on a face opposite to the face in contact with said heat transfer member.

In such a cabinet having a heat radiation function according to the invention, the heat is transmitted to the heat transfer member from the heat source inside the cabinet and radiated to the exterior via the heat transfer member, aforesaid heat radiation member, and ventilation holes. Further, the heat not transmitted to the heat transfer member and remaining inside the cabinet is radiated to the exterior via the ventilation holes from the aforesaid thermally conductive heat radiation member. In addition, this heat radiation member insulates the heat transfer member from the exterior of the cabinet. Consequently, it is possible to stably and efficiently radiate the heat generated inside the cabinet by the natural air cooling since the heat transfer member has no coating thereon which prevents the heat radiation.

A cabinet of a third invention includes a cabinet body containing a heat source. A cover member is attached to an aperture of the cabinet and includes: a guide portion that guides, to an exterior of the cabinet, a heat transfer member transferring therethrough heat from the heat source by use of a hydraulic fluid; and a curved face with a predetermined curvature on a portion facing an interior of the cabinet when attached to the aperture so as to be in a contactable position with the heat transfer member inserted in the guide portion.

Therefore, in the assembly process of the cabinet having a heat radiation function according to the present invention, it is not necessary to machine the heat transfer member to bend in advance since it can bend in a direction of the position of the heat source inside the cabinet without any excessive deterioration in its property. Accordingly, it is possible to freely dispose a heat source inside a cabinet and freely decide with low cost the shape, size, and arrangement of a mechanism provided in a cover member and guiding a heat transfer member.

A cabinet of a fourth invention has a cover member including an incoming radiation member on a portion that faces an interior of the cabinet when attached to the aperture of the cabinet. Thus, heat radiated or circulated by convection inside the cabinet is collected concentratedly by the incoming radiation member and radiated to the exterior via the cover member and the heat radiation member. This makes it possible to also radiate, by the natural air cooling, heat other than the heat transmitted to the heat transfer member from the heat source inside the cabinet with efficiency.

A cabinet of a fifth invention includes a cabinet body containing a heat source. A cover member is attached to an aperture of the cabinet and includes: a guide portion that guides, to an exterior of the cabinet, a heat transfer member transferring therethrough heat from the heat source by use of a hydraulic fluid; a curved face with a predetermined curvature that connects with the guide portion; and an incoming radiation fin that has a height equal to a height of a portion of the curved face protruding most to the interior of the cabinet.

That is, the heat transfer member is guided to the vicinity of a tip of the incoming radiation fin by the guide portion. Consequently, heat radiation is achievable by the aforesaid natural air cooling even with a component thermally coupled to the heat transfer member disposed near the tip of the incoming radiation fin.

A heat radiation member according to a sixth invention is formed as a thermal conductor used for closing an aperture of a cabinet containing a heat source. The heat source is thermally coupled to a heat transfer member transferring therethrough heat by use of a hydraulic fluid. The heat radiation member includes a hole or a groove guiding the heat transfer member to an exterior of the aperture from an interior thereof. That is, such a heat radiation member corresponds to the aforesaid cover member. Accordingly, it is able to stably radiate heat generated inside the cabinet by the natural air cooling even when the cabinet includes a cover member for insulating a transfer member from both or one of the interior and exterior of the cabinet and for securing a heat radiation route from the heat transfer member to the exterior but this cover member does not directly function as a radiation fin.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 5 shows an example of a backlash.

DESCRIPTION OF THE PREFERRED EMBODIMENTS

Figure 1:
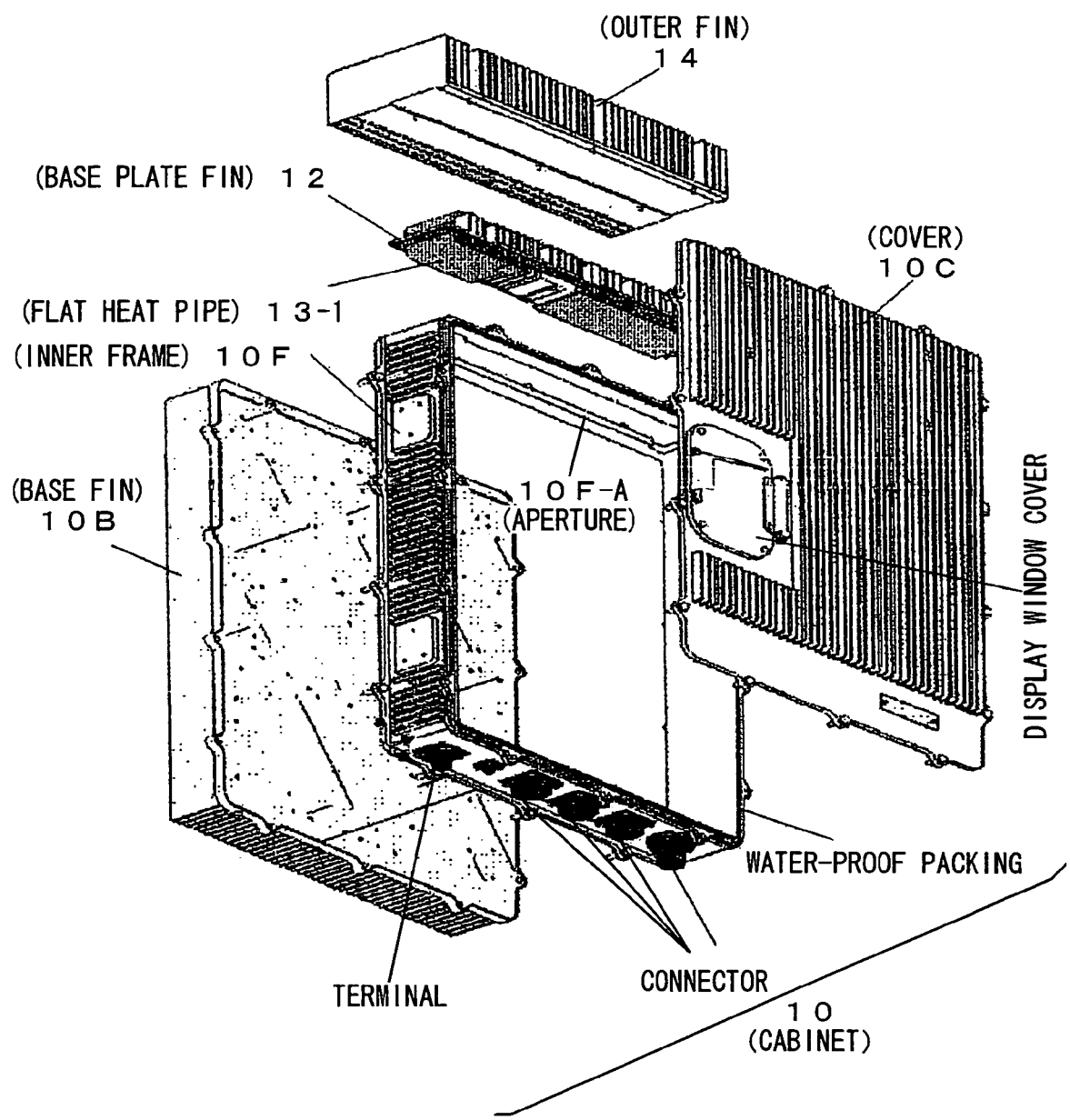
FIG. 1 is a perspective view of an embodiment of the present invention.
Figure 2:
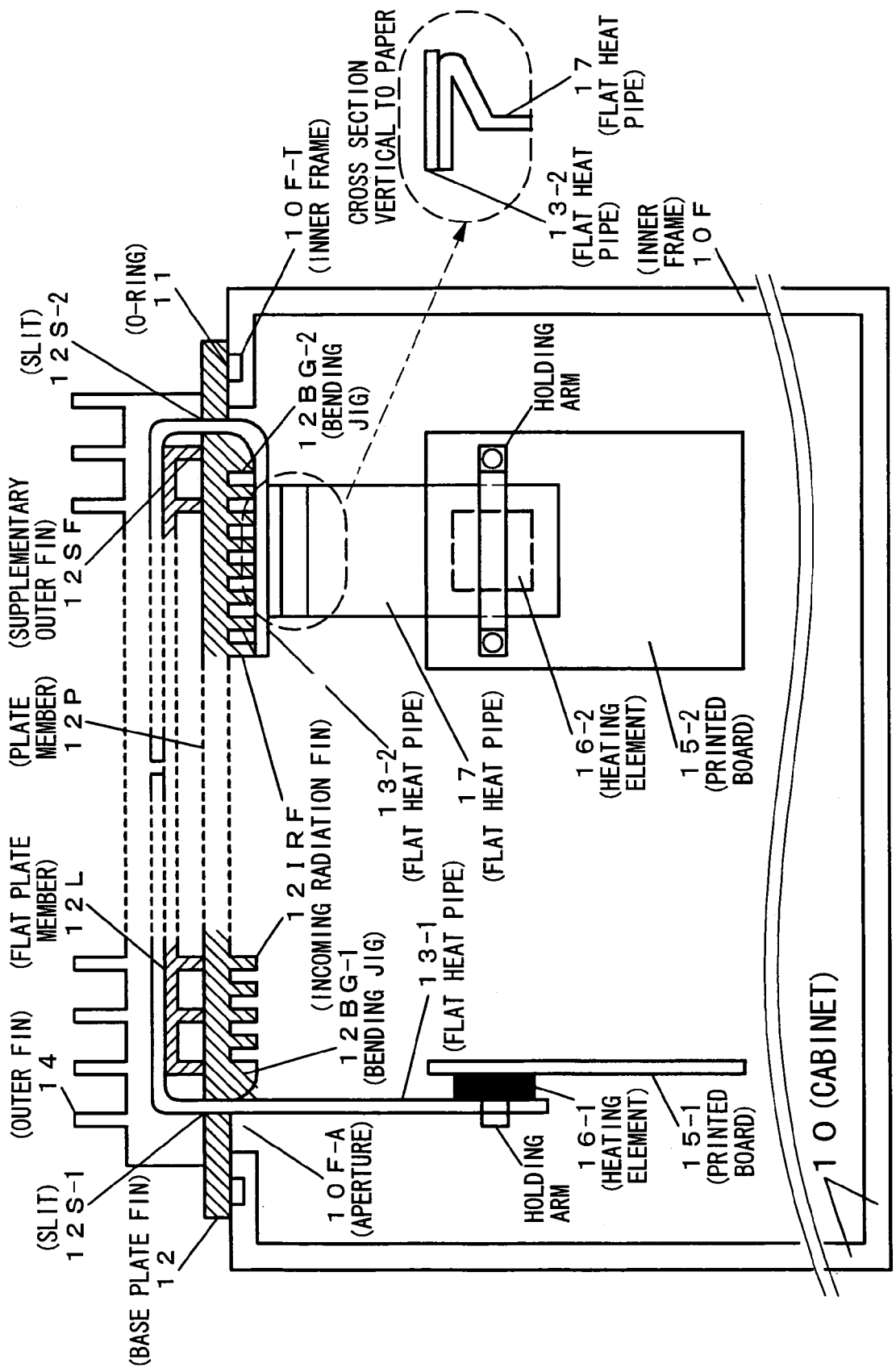
FIG. 2 is a cross sectional view of the embodiment of the present invention.
Figure 3:
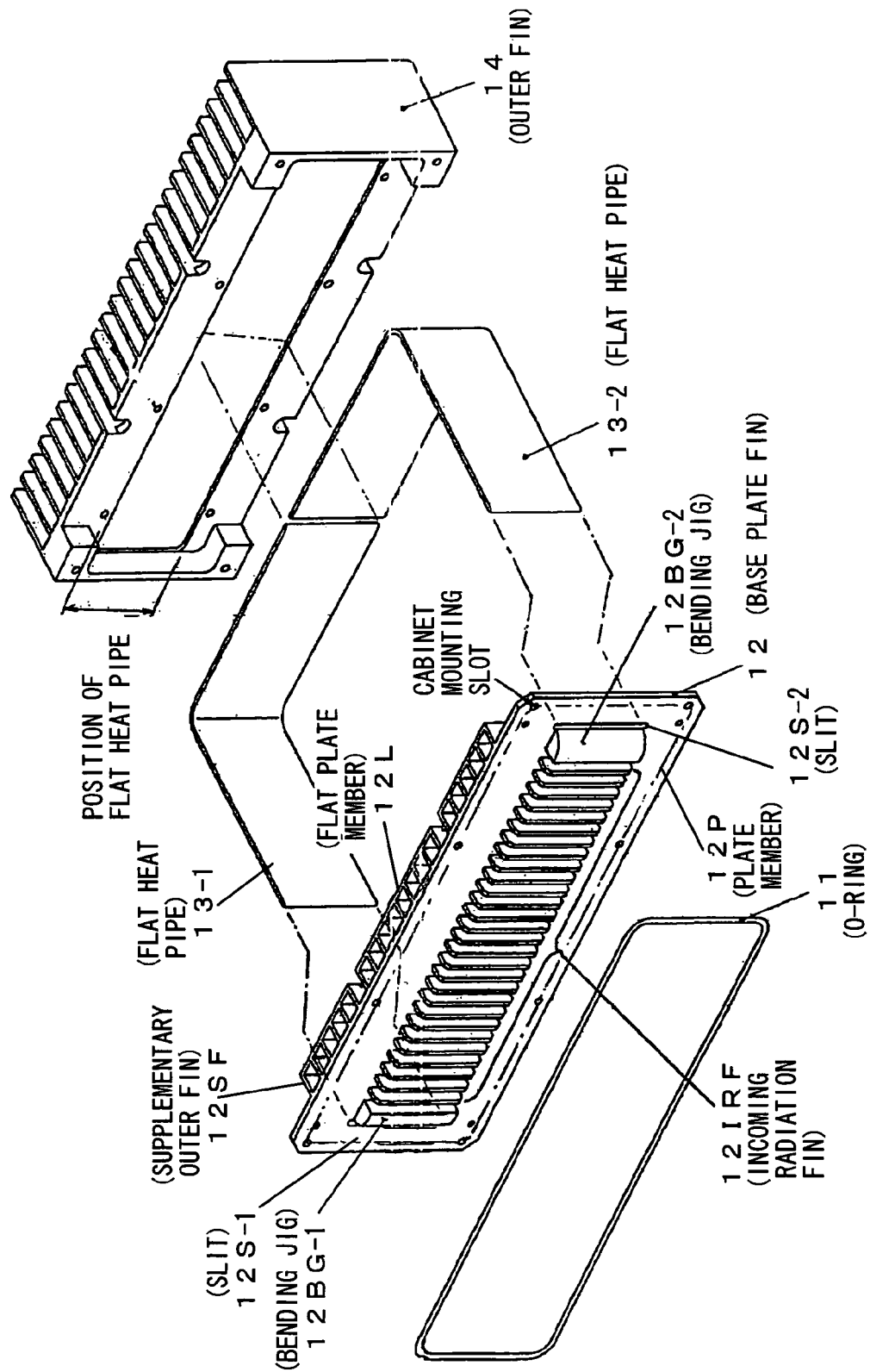
FIG. 3 is an assembly view (1) of the embodiment of the present invention.
Figure 4:
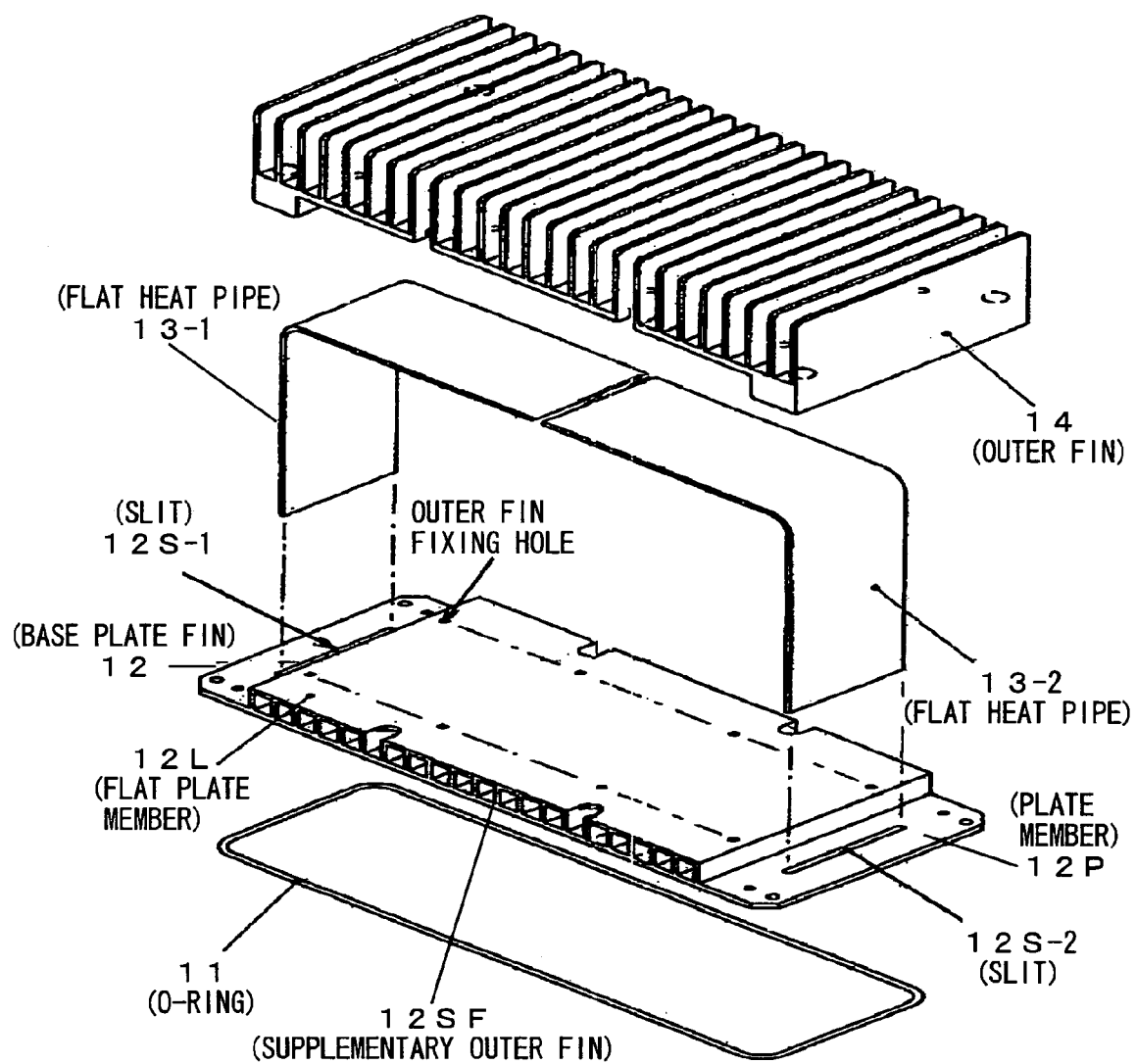
FIG. 4 is an assembly view (2) of the embodiment of the present invention.

Hereinafter, an embodiment of the present invention will be described in detail with reference to the drawings. FIG. 1 is a perspective view of an embodiment of the present invention. FIG. 2 is a cross sectional view of the embodiment of the present invention. FIG. 3 is an assembly view (1) of the embodiment of the present invention. FIG. 4 is an assembly view (2) of the embodiment of the present invention. Hereinafter, the configuration of the embodiment of the present invention will be described with reference to FIG. 1 to FIG. 4.

A cabinet 10 contains elements (hereinafter referred to simply as a circuit) of a radio base station apparatus other than elements disposed outdoors such as an antenna. As shown in FIG. 1, the cabinet 10 is composed of an inner frame 10F with a rectangular cross section corresponding to a top portion, side portions, and a bottom portion of the cabinet 10, a base fin 10B screw-fixed to one aperture of the inner frame 10F, and a cover 10C screw-fixed to the other aperture of the inner frame 10F. The inner frame 10F has a rectangular aperture 10F-A on the top portion, and connectors and terminals used for connecting the following items to the aforesaid circuit attached to the bottom portion:

1) A feeder laid to a feeding point of an antenna (not shown);

2) A communication link used for exchange of information with a base station controlling station;

3) A power supply line used for supplying driving power from an exterior;

4) A cable for connection to equipment applied to maintenance and operation; and 5) A ground line for being grounded on the earth.

Note that waterproof packing rings are fitted into marginal parts of a pair of opposing apertures of the inner frame 10F so as to watertightly connect the aforesaid inner frame 10F and the base fin 10B, and the inner frame 10F and the cover 10C. The inner frame 10F has a groove 10F-T in a peripheral area of the aforesaid aperture 10F-A on the top portion, and the groove has an O-ring 11 serving as a waterproof packing fitted thereto, a base plate fin 12 is screw-fixed to the inner frame 10F to sandwich the O-ring 11 therebetween.

The base plate fin 12 is formed of the following elements as shown in FIG. 2:

1) A plate member 12P having substantially rectangular slits 12S-1, 12S-2 with a predetermined curvature at positions adjacent to inner sides of two short sides of the aperture 10F-A of the inner frame 10F, respectively;

2) An incoming radiation fin 12IRF formed of a plurality of projections that protrudes at a regular pitch in an area of a bottom face of the plate member 12P, the area being surrounded by the aperture 10F-A of the inner frame 10F;

3) Bending jigs 12BG-1, 12BG-2 having curved faces that smoothly continue from faces with longer sides of faces forming the aforesaid slits 12S-1, 12S-2 in the area surrounded by the aperture 10F-A of the inner frame 10F, the height of top portions of the bending jigs 12BG-1, 12BG-2 from the bottom face of the plate member 12 being equal to that of top portions of the incoming radiation fin 12IRF; and 4) A supplementary outer fin 12SF constituted of an array of projections and a flat plate member 12L, the projections provided at a regular pitch in parallel to the longer sides of the slits 12S-1, 12S-2 in an area sandwiched by the slits 12S-1, 12S-2 of an upper face of the plate member 12P, the plate member 12L being bridged on top portions of the array of these projections.

One ends of flat heat pipes 13-1, 13-2 are inserted in the slits 12S-1, 12S-2 respectively, and then the other ends thereof are both bent as shown in FIG. 2 to FIG. 4 to be in contact with an upper face of the supplementary outer fin 12S-F (the plate member 12L) with substantially the same length. The other end of the flat heat pipe 13-2 passes through the slit 12S-2 and is bent along the curved face of the bending jig 12BG-2 to substantially keep in contact with the top portions of the incoming radiation fin 12IRF with a desired length.

An outer fin 14 having a groove on a bottom face thereof is screw-fixed to the upper face of the plate member 12P. The groove has a shape and a size to satisfy the following conditions:

1) The outer fin 14 and the supplementary outer fin 12SF (the plate member 12L) are stably thermally coupled to the flat heat pipes 13-1, 13-2 without causing any deterioration in characteristics of the flat heat pipes 13-1, 13-2;

2) A ventilation path is formed between the supplementary outer fin 12SF and the exterior; and 3) The flat heat pipes 13-1, 13-2 are insulated from the exterior by the outer fin 14 and the plate member 12L so as to seal the flat heat pipes 13-1, 13-2.

In a hollow portion of the cabinet 10 provided are a printed board 15-1 disposed in parallel to the longer sides of an aperture of the slit 12-S1 and a printed board 15-2 disposed perpendicularly to the longer sides of an aperture of the slit 12S-2. A heating element 16-1 such as an LSI (Large Scale Integration) mounted on the printed board 15-1 is thermally coupled to one end of the flat heat pipe 13-1. Further, a heating element 16-2 mounted on the printed board 15-2 is thermally coupled to one end of a flat heat pipe 17, and the other end of the flat heat pipe 17 is in contact with the other end of the flat heat pipe 13-2 that is shaped in advance as described above.

Note that the constituent elements of this embodiment excluding the O-ring 11, the printed boards 15-1, 15-2, and the heating elements 16-1, 16-2 are preferably formed of a metal material such as an aluminum material to have the same heat conductivity.

The operation of this embodiment is as follows.

Heat is generated by the heating element 16-1 (16-2) inside the cabinet 10. The flat heat pipe 13-1 (17, 13-2) closely thermally coupled to the heating element 16-1 (16-2) guides most of the heat to the outer fin 14 and the supplementary outer fin 12SF for radiation of the heat to the exterior. Here, the flat heat pipes 13-1, 13-2 are sandwiched by the outer fin 14 and the base plate fin 12 and at least upper and lower faces of bent portions "n" in FIG. 3 are in surface contact with the outer fin 14 and the base plate fin 12, respectively.

Further, the following routes are for radiation of some of the heat generated inside the cabinet 10 to the exterior which is not transmitted to the aforesaid flat heat pipe 13-1 (17, 13-2) but circulates by convection or is radiated.

1) A route via outer wall faces of the base fin 10B and the cover 10C and side portions and a bottom portion of wall faces of the inner frame 10F.

2) A route via the incoming radiation fin 12IRF and the outer fin 14.

3) A route via the incoming radiation fin 12IRF, the flat heat pipes 13-1, 13-2, and the outer fin 14 (or the supplementary outer fin 12SF).

Inside the cabinet 10, the flat heat pipes 13-1, 13-2, 17 are insulated from the exterior by the inner frame 10F, the base fin 10B, the cover 10C, and the base plate fin 12. Further, in an area sandwiched by the outer fin 14 and the base plate fin 12, the flat heat pipes 13-1, 13-2 are insulated from the exterior by the bottom portion of the outer fin 14 and the base plate fin 12 (the plate member 12L).

Therefore, if the heating element 16-1 (16-2) is the source of major heat generated inside the cabinet 10, it is possible to radiate the heat to the exterior quickly and efficiently via the flat heat pipe 13-1 (17, 13-2) (16-2), the outer fin 14, and the supplementary outer fin 12SF which are closely thermally coupled to the heating element 16-1. Moreover, the insulation of the flat heat pipes 13-1, 13-2, 17 from the exterior makes it is possible to prevent deterioration in their characteristics and faults that would be caused if they were weather-beaten as well as deterioration in heat radiation characteristics that would be caused if the flat heat pipes 13-1, 13-2, 17 had corrosion-resistant coating thereon.

As described above, this embodiment can realize natural air cooling of heat generated inside the cabinet 10 with reliability and stability without extremely increasing in the area of wall faces of the cabinet 10. Consequently, the system and apparatus to which the present invention is applied is able to provide high-level output without occurrence of noises which deteriorates surrounding conditions and with the downsizing and cost reduction thereof achieved.

Note that in this embodiment the incoming radiation fin 12IRF is constructed of a set of plural projections disposed in the aperture 10F-A around which warmed air inside the inner frame 10F (the cabinet 10) may be mostly distributed. However, such an incoming radiation fin 12IRF may be formed at any positions on the inner walls of the cabinet 10 (including inner walls of the inner frame 10F, the base fin 10B, and the cover 10C) if heat radiation is realized with a desired degree according to the natural air cooling.

Moreover, in this embodiment the outer fin 14 has the pitch of 8 mm to 10 mm to be suitable for the characteristics of fluid air in the exterior and desirable for efficient natural air cooling. However, the physical shape, size and arrangement of such an outer fin 14 are settable freely as long as natural air cooling is achieved with desired efficiency.

Further, in this embodiment, the pitch of the incoming radiation fin 12IRF is set to be far smaller than the pitch of the outer fin 14 in order to secure a large heat receiving area inside the cabinet 10. However, the physical shape, size, and arrangement of such an incoming radiation fin 12IRF are settable freely as long as natural air cooling is achieved with desired efficiency.

Moreover, this embodiment employs the flat heat pipes 13-1, 13-2 having a flat external shape for the purpose of suppressing, to an allowably small level, increase and deviation in thermal resistance of side walls and so on of the cabinet 10 having the slits 12S-1, 12S-2. However, the shape of such heat pipes is settable freely if the decrease in heat radiation efficiency due to the increase and deviation of the thermal resistance is allowable.

Further, in this embodiment, thermal coupling between the flat heat pipes 17, 13-2 is maintained at a high degree by using, for example as shown in FIG. 5, a backlash of the heat pipe 13-2 that occurs due to an elasticity specific to the heat pipe 13-2 by bending the heat pipe 13-2 along the bending jig 12BG-2. A restoring force of an elastic tip portion of the flat heat pipe 17 acts between the flat heat pipes 13-2, 17, so that the flat heat pipe 17 pushes up the heat pipe 13-2 until the incoming radiation fin 12IRF presses down the heat pipe 13-2, as shown in detail as "a cross section vertical to the paper" in FIG. 2. However, if the flat heat pipe 13-1 is not bent along the bending jig 12BG-1, and is thermally coupled to the flat heat pipe 17, for example, the heat pipes 13-1, 17 may be fixed to each other with a fixing metal or the like to keep the thermal coupling therebetween.

Furthermore, the heating element 16-2 is thermally coupled to the flat heat pipe 17 closely thermally coupled to the flat heat pipe 13-2. However, the heating element 16-2 may be directly thermally coupled to the tip of the flat heat pipe 13-2 by gradually twisting the flat heat pipe 13-2 in a longitudinal direction thereof, for example.

Moreover, this embodiment is provided with the supplementary outer fin 12SF in addition to the outer fin 14. However, the present invention is not limited to such a configuration, and both or one of the outer fin 14 and the supplementary outer fin 12SF are unnecessary if heat radiation is achieved with desired efficiency by the natural air cooling.

Further, in this embodiment, portions of the flat heat pipes 13-1, 13-2 are guided from the interior of the cabinet 10 through the slits 12S-1, 12S-2 and insulated from the exterior by the outer fin 14 and the plate member 12L (the supplementary outer fin 12SF). Outside air passes through the ventilation path formed between the outer fin 14 and the supplementary outer fin 12SF, thereby radiating heat efficiently by the outer fin 14.

However, the flat heat pipes 13-1, 13-2 may be insulated from the exterior by either of the following elements:

1) A cover member such as a rack, a shelf, or the like that thermally coupled to a member substituting the outer fin 14 and that replaces the groove formed in the bottom portion of the outer fin 14; and 2) A cover member or an outer fin that is in close contact with the plate member 12P in place of the plate member 12L to cover the flat heat pipes 13-1, 13-2, in case that the supplementary outer fin 12SF is not providable.

Furthermore, in this embodiment, the shape and size of the bending jigs 12BG-1, 12BG-2 and a curvature of slopes formed on side faces of the bending jigs 12BG-1, 12BG-2 may be arbitrarily decided if (a) they adapt to the position of the heating element thermally coupled to the tip of the heat pipe bent along the slope as well as to the shapes, sizes, and materials of this heat pipe and of a route inside the heat pipe through which a hydraulic fluid moves, and the characteristics of the hydraulic fluid; (b) desired thermal resistance and thermal conductivity are obtainable; and (c) in the assembling process the heat pipe can be bent with high accuracy at low cost. Therefore, it is not necessary that the bending jigs 12BG-1, 12BG-2 have a height equal to that of the top portions of the incoming radiation fin 12IRF.

Further, in this embodiment, the bending jigs 12BG-1, 12BG-2 may be formed, for example, as a single projection (or an array of a plurality of projections) also serving as the incoming radiation fin 12IRF, or as a notch (or an array of notches) formed in the incoming radiation fin 12IRF in view of improving heat receiving efficiency of the incoming radiation fin 12IRF.

Moreover, in this embodiment, the width of the flat heat pipes 13-1, 13-2 is not greatly different from that of the outer fin 14 and the supplementary outer fin 12SR, so that the flat heat pipes 13-1, 13-2 are thermally coupled to most of areas of the outer fin 14 and the supplementary outer fin 12SR with substantial uniformity. However, the present invention is not limited to such a configuration. For example, heat pipes with nonflat cross sectional shapes are applicable, or when the width of the applied heat pipes greatly differs from that of the outer fin 14 and the supplementary outer fin 12SR, these heat pipes may be laid such that temperature distributions of the outer fin 14 and the supplementary outer fin 12SR are to be uniform with a desired degree.

Further, the essential portion of this embodiment is structured of the outer fin 14 and the base plate fin 12 which is combined with the outer fin 14 to insulate the flat heat pipes 13-1, 13-2 from the exterior, realizing the aforesaid natural air cooling. However, such an essential portion may have any of the following structure, for example:

1) A set of members that are assembled and joined together by a building block system according to the maximum quantity of heat to be radiated;

2) A set of small members constituting respective portions and made of existing materials or materials of a standard size and shape through combining or jointing with each other irrespective of the aforesaid heat quantity;

3) A set of different members exchangeable depending on a desired heat quantity and standardized in terms of the assembly mechanism;

4) A single member integrated with a heat pipe or a valve or the like used for confining a hydraulic fluid in view of reduction in the number of man-hours taken for the assembly by reducing the number of components or in view of yield improvement;

5) A single member being a part of a heat pipe or being a route for transferring hydraulic fluid, and connectable to another heat pipe.

Further, in this embodiment, most of the heat generated in the heating elements 16-1, 16-2 is transmitted to the area sandwiched by the base plate fin 12 and the outer fin 14 via the heat pipes and is radiated to the exterior via the outer fin 14 and the supplementary outer fin 12SF. However, the present invention is not limited to such a configuration. All or part of the flat heat pipes 13-1, 13-2, 17 may be replaced by, for example, a heat transfer element such as a thermosiphon or the like that transfers heat therethrough efficiently by a circulative heat medium (hydraulic fluid).

The invention is not limited to the above embodiments and various modifications may be made without departing from the spirit and scope of the invention. Any improvement may be made in part or all of the components.

What is claimed is:

1. A cabinet having a heat radiation function, comprising:
a cabinet body containing a heat source;
a cover member attached to an aperture of said cabinet, and including a guide portion that guides a heat transfer member to an exterior of said cabinet, the heat transfer member transferring therethrough heat from said heat source by use of a hydraulic fluid; and
a heat radiation part being a thermal conductor and in contact with said heat transfer member on a face, and covering said heat transfer member from the exterior of said cabinet and having a heat radiation member on a face opposite to the face in contact with said heat transfer member.

2. A cabinet having a heat radiation function, comprising:
a cabinet body containing a heat source;
a cover member attached to an aperture of said cabinet, and including a guide portion that guides a heat transfer member to an exterior of said cabinet, the heat transfer member transferring therethrough heat from said heat source by use of a hydraulic fluid;
a first heat radiation member with heat conductivity, having ventilation paths between said heat radiation member and said cover member, and thermally coupled with a portion protruding to the exterior of said cabinet via said guide portion; and
a heat radiation part being a thermal conductor and in contact with said heat transfer member on a face, and covering a portion of said heat transfer member so as not to block any of the ventilation paths of said first heat radiation member and having a second heat radiation member on a face opposite to the face in contact with said heat transfer member, the portion protruding from said cover member to the exterior of said cabinet.

3. A cabinet having a heat radiation function, comprising:
a cabinet body containing a heat source; and
a cover member attached to an aperture of said cabinet, and including a guide portion that guides a heat transfer member to an exterior of said cabinet, and a curved face of a predetermined curvature on a portion facing an interior of said cabinet when attached to the aperture so as to be in a contactable position with said heat transfer member inserted in said guide portion, the heat transfer member transferring therethrough heat from said heat source by use of a hydraulic fluid.

4. The cabinet according to claim 1, wherein
said cabinet body further includes an incoming radiation member on a portion that faces an interior of said cabinet when attached to the aperture.

5. The cabinet according to claim 2, wherein
said cabinet body further includes an incoming radiation member on a portion that faces an interior of said cabinet when attached to the aperture.

6. The cabinet according to claim 3, wherein
said cabinet body further includes an incoming radiation member on a portion that faces an interior of said cabinet when attached to the aperture.

7. A cabinet having a heat radiation function, comprising:
a cabinet body containing a heat source; and
a cover member attached to an aperture of said cabinet, and including a guide portion that guides a heat transfer member to an exterior of said cabinet, a curved face of a predetermined curvature connecting with said guide portion, and an incoming radiation fin having a height equal to a height of a portion of said curved face protruding most to an interior of said cabinet, the heat transfer member transferring therethrough heat from said heat source by use of a hydraulic fluid.

8. A heat radiation member comprising:
a thermal conductor closing an aperture of a cabinet which contains a heat source which is thermally coupled to a heat transfer member for transferring therethrough heat by use of a hydraulic fluid, said thermal conductor having a hole or a groove guiding said heat transfer member from an interior of said cabinet to an exterior of said aperture.

* * * * *